United States Patent
Schrof et al.

(10) Patent No.: US 6,964,837 B2
(45) Date of Patent: Nov. 15, 2005

(54) UTILIZATION OF BEAM CROSSLINKABLE POLYMER COMPOSITIONS AS DATA RECORDING MEDIUM

(75) Inventors: Wolfgang Schrof, Neuleiningen (DE); Harald Röckel, Neustadt (DE); Rüdiger Füssl, Neustadt (DE); Karl-Heinz Schumacher, Neustadt (DE); Ralf Fink, Limburgerhof (DE)

(73) Assignee: BASF Aktiengesellschaft, Ludwigshafen (DE)

(*) Notice: Subject to any disclaimer, the term of this patent is extended or adjusted under 35 U.S.C. 154(b) by 0 days.

(21) Appl. No.: 10/258,586

(22) PCT Filed: May 4, 2001

(86) PCT No.: PCT/EP01/05055
§ 371 (c)(1), (2), (4) Date: Nov. 1, 2002

(87) PCT Pub. No.: WO01/84544
PCT Pub. Date: Nov. 8, 2001

(65) Prior Publication Data
US 2003/0175506 A1 Sep. 18, 2003

(30) Foreign Application Priority Data
May 4, 2000 (DE) .......................... 100 21 646
Mar. 6, 2001 (DE) .......................... 101 10 612

(51) Int. Cl.[7] .................. G03C 5/10; G03F 7/36
(52) U.S. Cl. ............ 430/139; 430/270.1; 430/271.1; 430/311; 430/320; 430/322; 430/523; 430/927; 428/343
(58) Field of Search ................ 430/139, 320, 430/270.1, 271.1, 311, 322, 927, 523; 428/343

(56) References Cited

U.S. PATENT DOCUMENTS

| | | | |
|---|---|---|---|
| 4,330,590 A | 5/1982 | Vesley | |
| 4,651,011 A | 3/1987 | Ors et al. | |
| 5,182,316 A * | 1/1993 | DeVoe et al. | ................. 522/99 |
| 5,955,002 A | 9/1999 | Neckers et al. | |
| 6,165,609 A * | 12/2000 | Curatolo | ..................... 428/343 |
| 6,242,504 B1 * | 6/2001 | Meyer-Roscher et al. | ..... 522/2 |

FOREIGN PATENT DOCUMENTS

| | | |
|---|---|---|
| DE | 2 411 169 | 9/1974 |
| DE | 38 44 444 | 8/1990 |
| DE | 40 37 079 | 5/1992 |
| DE | 198 26 716 | 1/1999 |
| DE | 198 36 788 | 2/2000 |
| DE | 199 35 624 | 2/2001 |
| DE | 199 46 898 | 4/2001 |
| DE | 100 08 295 | 8/2001 |
| EP | 0 246 848 | 11/1987 |
| EP | 0 720 015 | 7/1996 |
| EP | 0 921 168 | 10/1998 |
| EP | 0 904 853 | 3/1999 |
| EP | 0 947 565 | 4/1999 |
| WO | 96 42036 | 12/1996 |

* cited by examiner

Primary Examiner—Cynthia H. Kelly
(74) Attorney, Agent, or Firm—Oblon, Spivak, McClelland, Maier & Neustadt, P.C.

(57) ABSTRACT

The present invention relates to the use of at least one radiation crosslinkable, preferably UV crosslinkable, polymer composition as a data recording medium, especially in the form of what are known as smart coatings based on such polymer compositions, which in a further embodiment comprises at least one fluorescence chromophore, and also to a composite at least comprising one support and one layer comprising a radiation crosslinkable polymer composition comprising at least one fluorescence chromophore, and also, preferably, an additional UV absorbing layer.

23 Claims, 1 Drawing Sheet

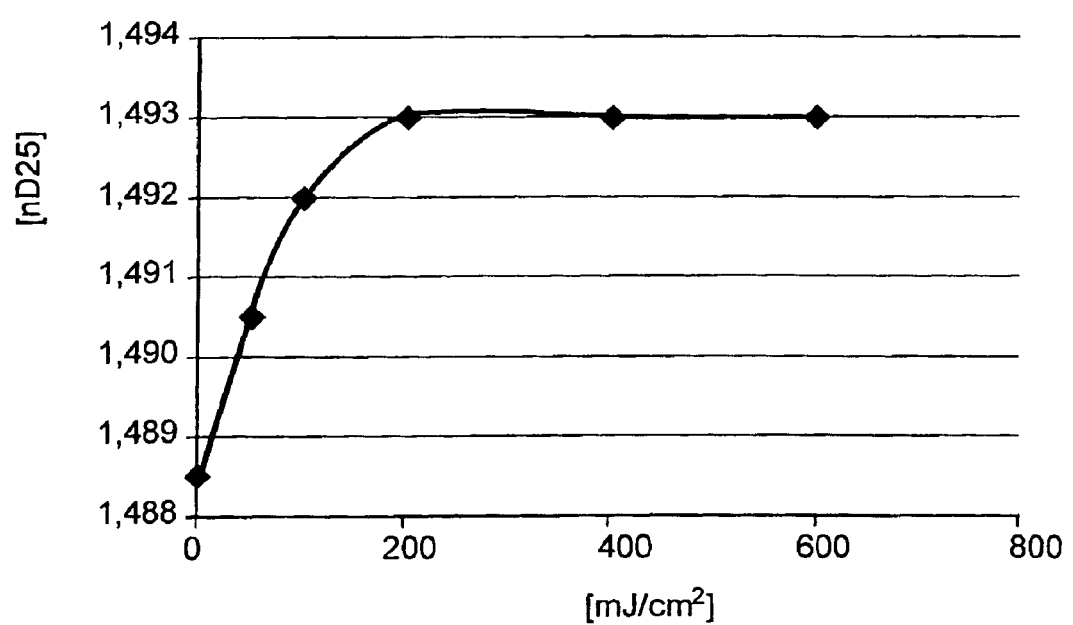

UTILIZATION OF BEAM CROSSLINKABLE POLYMER COMPOSITIONS AS DATA RECORDING MEDIUM

The present invention relates to the use of at least one radiation crosslinkable, preferably UV crosslinkable polymer composition as a data recording medium, especially in the form of so-called smart coatings based on such polymer compositions.

The present invention also relates, furthermore, to the use of at least one radiation crosslinkable polymer composition comprising at least one fluorescence chromophore as a data recording medium, and also to a composite. The composite comprises a support and a layer comprising at least one radiation crosslinkable polymer composition with at least one fluorescence chromophore. The composite preferably comprises an additional UV absorbing layer.

Addition polymers crosslinkable by UV light, and their use, for example, as adhesives—hotmelt adhesives, for example—or as coating compositions—such as paint, for example—are known. In this context, reference is made, for example, to DE-A 24 11 169, EP-A 0 246 848, DE-A 40 37 079 or DE-A 3 844 444 and also DE-A 199 35 624, DE-A 100 08 295 and DE-A 199 46 898 (adhesives) and to DE-A 198 36 788, EP-A 0 947 565, EP-A 0 921 168, and DE 198 26 716 (coating compositions, paints) and also to the prior art cited therein.

Coatings of this kind have not yet been used to date for storing data or as data recording media. Accordingly, the present invention makes use of a further property of such compositions, namely the ability to subject such UV crosslinkable polymer compositions to position-resolved irradiation and, by so doing, to imprint them with information which can then be read out again subsequently using appropriate reading devices.

One potential application of the polymer compositions of the present invention is that of so-called smart coatings. This term is used for coatings comprising the polymer composition used in accordance with the invention which in addition to their typical properties of, for example, promoting adhesion or protecting surfaces, possess readable information (data). This information may be digital information items (e.g., dot codes or bar codes) or may be holographic in nature.

One known application in this technical field of information storage in polymers is that of smart labels based on Tesafilm, a polypropylene-based polymer film. In this application of Tesafilm, referred to as "Tesa-ROM", the Tesafilm is written by heating it at individual sites/points with a laser and locally relaxing the stretched (oriented) polypropylene film. Above a certain temperature, therefore, the optical properties of the Tesafilm begin to change, and so information can be introduced into the Tesafilm. The Tesafilm remains transparent but reflects less light than previously. For the reading of the information thus stored, it is no longer the heat, i.e., the energy density of the laser light which is employed, but rather the brightness of the emitted light. Since "written" Tesafilm reflects less light than "unwritten" Tesafilm, a photosensitive cell can be used to read and evaluate the laser light reflected from the Tesafilm. A Tesafilm of this kind may then be bonded to a substrate and, accordingly, as a "smart label", in analogy to a bar code, can contain the information required in connection with the substrate in question, i.e., for example, the customer to which the article provided with the smart label is to be sent. Furthermore, according to its manufacturer, Tesa-ROM also possesses very general suitability as a data storage medium, in analogy to a CD.

Smart coatings and data recording media based on the free-radically or ionically polymerized, radiation crosslinkable polymer compositions under discussion here have not been disclosed to date.

Furthermore, the Tesa-ROM concept based on Tesafilm has the disadvantage that these films are thermally unstable and that, especially at relatively high ambient temperatures, the stored information is lost.

It is an object of the present invention to provide new data recording media which should be universally employable and should be easy to handle and use and preferably ensure simple readability of the stored information.

Accordingly the present invention provides for the use of at least one radiation crosslinkable polymer composition as a data recording medium.

Polymer compositions which may be used are, in principle, all radiation crosslinkable, preferably UV crosslinkable, free-radically or ionically polymerized addition polymers. In particular, the polymer composition used in accordance with the invention comprises an adhesive or coating composition, in each case in the form of a melt, solution or aqueous dispersion. In this context, reference is made to the prior art cited at the outset in relation to adhesives and coating compositions, whose content insofar as it relates to the polymer compositions described therein is fully incorporated by reference into the context of the present specification.

The polymer composition preferably further comprises at least one radiation activatable compound. This compound preferably comprises an ethylenically unsaturated, radiation activatable compound, in particular a compound from the group of the photoinitiators. By irradiation with high energy light, especially UV light, the radiation activatable compound brings about crosslinking of the polymer, preferably by means of a chemical grafting reaction of the photoinitiator with a spatially adjacent polymer chain. In particular, the crosslinking may take place by insertion of a carbonyl group of the photoinitiator into an adjacent C—H bond to form a —C—C—O—H group.

The polymer composition contains preferably from 0.0001 to 1 mol, with particular preference from 0.0002 to 0.5 mol, with very particular preference from 0.0003 to 0.05 mol of the radiation activatable compound, or of the radiation activatable molecule group, per 100 g of polymer.

The radiation activatable compound comprises, for example, acetophenone, benzophenone, benzoin ethers, benzil dialkyl ketals or derivatives thereof.

The radiation activatable compound or the radiation activatable molecule group is preferably attached to the polymer.

With particular preference, the radiation activatable molecule group is one which has been incorporated into the polymer chain by free-radical copolymerization. It is preferably an acrylic or methacrylic group.

Suitable copolymerizable radiation activatable compounds are photoinitiators such as acetophenone, benzophenone, and acetophenone or benzophenone derivatives, which comprise at least one, preferably one, ethylenically unsaturated group. The ethylenically unsaturated group is preferably an acrylic or methacrylic group.

The invention accordingly also provides for the use of at least one radiation crosslinkable polymer composition as a data recording medium, wherein acetophenone, benzophenone, a derivative of acetophenone or benzophenone, or a mixture of two or more thereof is used as radiation activatable compound and is preferably copolymer-attached.

The ethylenically unsaturated group may be attached directly to the phenyl ring of the acetophenone or benzophenone derivative. In general, there is a spacer group between the phenyl ring and the ethylenically unsaturated group.

The spacer group may contain, for example, up to 100 carbon atoms.

Suitable acetophenone or benzophenone derivatives are described, for example, in EP-A 346 734, EP-A 377 199 (claim 1), DE-A 4 037 079 (claim 1) and DE-A 3 844 444 (claim 1) and are incorporated into the disclosure content of the present specification by this reference. Preferred acetophenone derivatives and benzophenone derivatives are those of the formula

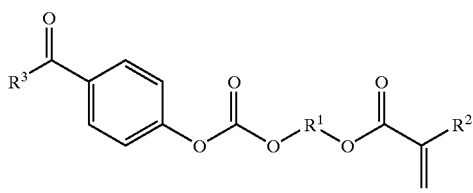

where $R^1$ is an organic radical having up to 30 carbon atoms, $R^2$ is a hydrogen atom or a methyl group, and $R^3$ is a substituted or unsubstituted phenyl group or a $C_1$–$C_4$ alkyl group.

With particular preference, $R^1$ is an alkylene group, in particular a $C_2$–$C_8$ alkylene group.

With particular preference, $R^3$ is a methyl group or a phenyl group.

In another embodiment of the present invention, it is possible to use what are known as dual cure systems, i.e., combinations of polymer and radiation activatable compounds which comprise more than one radiation activatable compound. Possible examples include a combination of a thermally crosslinkable and a UV crosslinkable compound, or a combination of a UV crosslinkable compound and a compound crosslinkable in the visible region of light. It is thus possible to crosslink the addition polymer "conventionally" with one of the two compounds and to effect position-resolved crosslinking with the aid of the other compound, and so to provide the polymer composition with an information item.

The addition polymer is preferably composed of free-radically or ionically polymerizable compounds (monomers), preferably those containing at least one ethylenically unsaturated group.

In a further embodiment, therefore, the invention provides for the use of at least one radiation crosslinkable polymer composition as a data recording medium, said polymer composition comprising at least one free-radically or ionically polymerized, radiation crosslinkable addition polymer formed from monomers containing at least one ethylenically unsaturated group.

The polymer consists preferably of at least 40% by weight, with particular preference at least 50% by weight, with very particular preference at least 80% by weight of principal monomers, i.e., preferably, monomers containing at least one ethylenically unsaturated group.

Accordingly, the invention also provides for the use of at least one radiation crosslinkable polymer composition as a data recording medium, wherein the free-radically or ionically polymerized, radiation crosslinkable addition polymer comprises at least 50% by weight of units formed starting from at least one monomer containing at least one ethylenically unsaturated group.

The principal monomers are selected from the group consisting of $\alpha,\beta$-monoethylenically unsaturated $C_3$–$C_6$ carboxylic acids, $C_1$–$C_{20}$ alkyl (meth)acrylates, butadiene, vinyl esters and allyl esters of $C_1$–$C_{12}$ alkylcarboxylic acids, vinylaromatics having up to 20 carbon atoms, ethylenically unsaturated nitriles, vinyl halides, vinyl ethers of alcohols containing 1 to 10 carbon atoms, aliphatic hydrocarbons having 2 to 8 carbon atoms and 1 or 2 double bonds, or mixtures of these monomers.

Examples that may be mentioned include (meth)acrylic alkyl esters with a $C_1$–$C_{10}$ alkyl radical, such as methyl methacrylate, methyl acrylate, butyl acrylate, ethyl acrylate and 2-ethylhexyl acrylate.

In particular, mixtures of the (meth)acrylic alkyl esters are also suitable.

Examples of vinyl esters of carboxylic acids having 1 to 20 carbon atoms are vinyl laurate, vinyl stearate, vinyl propionate, Versatic acid vinyl esters, and vinyl acetate.

Suitable vinylaromatic compounds are vinyltoluene, alpha- and p-methylstyrene, alpha-butylstyrene, 4-n-butylstyrene, 4-n-decylstyrene and, preferably, styrene.

Examples of nitriles are acrylonitrile and methacrylonitrile.

The vinyl halides are chloro-, fluoro- or bromo-substituted ethylenically unsaturated compounds, preferably vinyl chloride and vinylidene chloride.

Examples of vinyl ethers which may be mentioned include vinyl methyl ether and vinyl isobutyl ether. Preference is given to vinyl ethers of the alcohols containing 1 to 4 carbon atoms.

Hydrocarbons having 2 to 8 carbon atoms and two olefinic double bonds that may be mentioned include butadiene, isoprene and chloroprene.

Preferred principal monomers are the $C_1$ to $C_{10}$ alkyl acrylates and methacrylates, especially $C_1$–$C_8$ alkyl acrylates and methacrylates, particular preference being given in each case to the acrylates.

Very particular preference is given to methyl (meth)acrylate, ethyl (meth)acrylate, n-butyl (meth)acrylate, n-hexyl (meth)acrylate, octyl (meth)acrylate and 2-ethylhexyl (meth)acrylate, and mixtures of these monomers.

Besides the principal monomers, the polymer may include further monomers, examples being monomers containing carboxylic acid, sulfonic acid or phosphonic acid groups. Carboxylic acid groups are preferred. Examples that may be mentioned include acrylic acid, methacrylic acid, itaconic acid, maleic acid, and fumaric acid.

Further monomers include, for example, hydroxyl-containing monomers, especially $C_1$–$C_{10}$ hydroxyalkyl (meth)acrylates, and (meth)acrylamide.

Mention may be made, furthermore, of phenyloxyethyl glycol mono(meth)acrylate, glycidyl acrylate, glycidyl methacrylate, and amino (meth)acrylates such as 2-aminoethyl (meth)acrylate.

Monomers which in addition to the double bond carry further functional groups, e.g., isocyanate, amino, hydroxyl, amide or glycidyl, may improve, for example, the adhesion to substrates.

In the polymer composition, use is made in particular of an addition polymer composed of from 50 to 99.95% by weight of monomers containing at least one ethylenically unsaturated group and from 0.05 to 50% by weight of a radiation activatable compound, preferably from 50 to 99.95% by weight of $C_1$–$C_{20}$ alkyl (meth)acrylate and from 0.05 to 50% by weight of a benzophenone derivative or acetophenone derivative.

Accordingly, in a further embodiment, the invention provides for the use of at least one polymer composition as a data recording medium, wherein the addition polymer has been formed from 50 to 99.95% by weight of monomers containing at least one ethylenically unsaturated group and 0.05 to 50% by weight of a radiation activatable compound, preferably copolymer-attached.

In a further embodiment, the invention provides for the use of at least one polymer composition comprising at least one fluorescence chromphore as a data recording medium.

In accordance with the invention, the polymer composiiton may contain from 0.05 to 5% by weight of fluorescence chromophore, based on the overall polymer composition, preferably from 0.1 to 3% by weight, in particular from 0.1 to 1% by weight.

The fluorescence chromophore comprises, for example, coumarin, (bis)stilbene, perylene, phenanthridine, fluorene, or a derivative of coumarin, (bis)stilbene, perylene, phenanthridine or fluorene. In the context of the present invention it is also possible to use mixtures of two or more fluorescence chromophores.

In one preferred embodiment of the present invention, the fluorescence chromophore is attached to the polymer. In the context of the present invention, incorporation into the polymer may take place, for example, by the reaction of a reactive group of the fluorescence chromophore, for example, an ethylenically unsaturated group.

The ethylenically unsaturated group may be attached directly to the fluorescent molecular moiety or may be part of the fluorescent molecular moiety. It is, however, likewise possible for there to be a spacer group between the fluorescent molecular moiety and the ethylenically unsaturated group. The spacer group may contain, for example, up to 100 carbon atoms; preferably, the spacer group is an alkyl group.

Through the use of a fluorescence chromophore, incorporated by mixing or by copolymerization, this chromophore takes part in the radiation induced, especially UV induced, crosslinking reaction. By this means, the fluorescence is effectively suppressed at the areas exposed to light. In the context of the present invention, a synergistic effect occurs with preference; in other words, targeted exposure of the photoinitiator to light, and thus absorption of the radiation by the photoinitiator, leads to efficient quenching of the fluorescence chromophore. A macroscopically different degree of crosslinking, and thus differing intensity of fluorescence in such a polymer layer, may be produced, for example, by means of mask technology.

In the polymer composition, use is made in particular of an addition polymer composed of from 50 to 99.90% by weight of monomers containing at least one ethylenically unsaturated group, from 0.05 to 45% by weight of a radiation activatable compound, preferably copolymer-attached, and from 0.05 to 5% by weight of a fluorescence chromophore, preferably copolymer-attached, preferably from 50 to 99.90% by weight of $C_1$–$C_{20}$ alkyl (meth) acrylate, from 0.05 to 45% by weight of a benzophenone or acetophenone derivative, and from 0.05 to 5% by weight of a bisstilbene derivative, in which the total amount of monomer, radiation activatable compound, and fluorescence chromophore is 100%.

The polymer composition preferably has a K value of >10, more preferably from 30 to 100, and in particular from 30 to 80, measured in each case in tetrahydrofuran (1% strength solution, 21° C.).

The K value of Fikentscher is a measure of the molecular weight and the viscosity of the addition polymer.

The glass transition temperature of the polymer is generally below 200° C., preferably from –60° C. to <200° C., more preferably from –50 to +150° C., with particular preference from –45 to +120° C., and with very particular preference from –40 to +100° C.

The glass transition temperature of the addition polymer may be determined in accordance with customary methods, such as differential thermoanalysis or differential scanning calorimetry (see, e.g., ASTM 3418/82, midpoint temperature).

The addition polymers used in accordance with the invention may be prepared by copolymerizing the monomeric components using the customary polymerization initiators and, if desired, regulators, polymerization being carried out at the customary temperatures in bulk, in emulsion, e.g., in water or liquid hydrocarbons, or in solution. The copolymers are preferably prepared by polymerizing the monomers in solvents, especially in solvents with a boiling range from 50 to 150° C., preferably from 60 to 120° C., using the customary amounts of polymerization initiators, which are generally from 0.01 to 10, in particular from 0.1 to 4% by weight, based on the overall weight of the monomers. Suitable solvents include especially alcohols, such as methanol, ethanol, n- and iso-propanol, n- and iso-butanol, preferably isopropanol and/or isobutanol, and also hydrocarbons such as toluene and especially petroleum spirits with a boiling range of from 60 to 120° C. It is also possible to use ketones, such as acetone, methyl ethyl ketone and methyl isobutyl ketone, and esters, such as ethyl acetate, and also mixtures comprising isopropanol and/or isobutanol in amounts of from 5 to 95, in particular from 10 to 80, preferably from 25 to 60% by weight, based on the solvent mixture used.

In the case of a solution polymerization, examples of appropriate polymerization initiators include azo compounds, ketone peroxides, and alkyl peroxides.

Following the polymerization in solution, the solvents may if desired be separated off under reduced pressure, operating at elevated temperatures in the range, for example, from 100 to 150° C. The addition polymers may then be used in the solvent free state, i.e., as melts. In many cases it is also of advantage to prepare the novel UV crosslinkable addition polymers by polymerization in bulk, i.e., without the use of a solvent, in which case it is possible to operate batchwise or else continuously, in accordance, for example, with the information in U.S. Pat. No. 4,042,768.

The polymers used in the composition used in accordance with the invention are preferably solvent free. A residual solvent content, of organic solvents and/or water, for example, may, however, amount to less than 10 parts by weight, in particular less than 5 parts by weight, with particular preference less than 2 parts by weight, with very particular preference less than 1 part by weight of solvent per 100 parts by weight of polymer.

Regarding further details of the polymerization of the addition polymers under discussion here, reference is made to DE 19935624.6 (emulsion polymerization) and to DE 10008295.5 and also DE 19946898.2, to the prior art cited in each of them, and to general textbooks for free-radical polymerizations, whose content is included in its entirety in the context of the present specification, by reference.

Regarding the ionic polymerization which may likewise be used, depending on the monomers, reference is likewise made to the relevant textbooks.

The polymer composition may be present as a melt, as a solution in an organic solvent, or as an aqueous dispersion and may be used in this form.

Preferably, the polymer compositions are used as a melt, i.e., in substantially solvent free form (solvent content preferably less than 2% by weight, based on the polymer).

The polymer composition may be applied, preferably from the melt, by conventional methods, e.g., brushing, rolling, flow coating, knife coating, and extrusion, to supports. In the case of the solution or aqueous dispersion, the solvent or water is removed, generally by drying.

To increase the fluidity of the polymer composition, its temperature in the case of melt application may be from 10 to 150° C., preferably from 50 to 150° C., with particular preference from 100 to 150° C.

Preferred coat thicknesses are, for example, from 2 to 200 $\mu$m, with particular preference from 5 to 150 $\mu$m, with very particular preference from 10 to 100 $\mu$m.

Examples of suitable supports are labels made of paper or polymer, e.g., polyesters, polyolefins or PVC, and also adhesive tapes or films made from the aforementioned polymers.

Particular mention may be made of the following: polymer films, especially of polyethylene, oriented polypropylene, polyamide, polyethylene terephthalate, cellulose acetate, cellophane, metal (e.g., aluminum) coated (vapor deposited) polymer film, or else paper, card or metal foils, especially aluminum foils. Said films and foils may also be printed with printing inks, for example. Furthermore, it is also possible to coat metallic surfaces, especially aluminum, iron, steel or chrome.

Subsequently, the polymer compositions are exposed to high energy radiation, preferably UV light.

For this purpose, in general, the coated supports are placed on a conveyor belt and the conveyor belt is guided past a directed, high energy radiation source, e.g., a laser. In the course of this operation, the polymer composition may initially undergo crosslinking thermally or by means of high energy irradiated in a positionally unspecific manner. In order to introduce information, this is followed by local crosslinking by means of a directed radiation source, e.g., a UV laser. With this procedure, it is possible with advantage to make use of the dual cure systems already described above, using different kinds of radiation activatable compounds. In this case, a possible procedure is as follows:

Irradiation is carried out first in the visible wavelength range (undirected) followed by directed irradiation with UV light, or vice versa;

Crosslinking is carried out first thermally (undirected) followed by directed irradiation with UW light.

A further variant, using one kind of radiation activatable compound, comprises first effecting undirected crosslinking (precrosslinking) with a radiation dose too low to activate all of the potential groups which cause crosslinking, and then to carry out further radiation in a directed manner, in order to introduce information.

The degree of crosslinking and, respectively, of information input into the polymer composition depends on the duration and intensity (dose) of irradiation.

The radiative energy (UV dose) in total is preferably from 100 to 2000 mJ/cm$^2$ of irradiated area.

The polymer composition may of course be present as an adhesion promoting layer between two supports, preferably between two supports of the abovementioned kind, and may then be subjected to irradiation with UV light, especially laser light, in order to introduce information. The polymer compositions in question are generally activatable within a wavelength range from 200 to 2000 nm, preferably from 200 to 500 nm, and in particular from 230 to 400 nm. The depth of writing may be chosen arbitrarily within wide ranges and is typically from 5 to 100 micrometers. The resolution of such an irradiation is generally better than 10 micrometers.

By means of the laser irradiation, e.g., by means of two interfering UV lasers, a permanent, position-resolved "crosslinking pattern" is written into the polymer composition, applied in layer form, and may be read out subsequently by means of appropriate devices. This is preferably done spectroscopically, or preferably by means of IR (absorption spectrum) or Raman (reflectance spectrum) spectroscopy, preferably confocal Raman spectroscopy, or by determining the difference in refractive index between regions with and without information in a position-resolved manner, i.e., over the area, over the depth profile, or over area and depth profile. Furthermore, exposed and unexposed regions differ in respect of their luminescence. Preferably, exposed regions exhibit a luminescence which is pronounced in contrast to that of crosslinked regions. Particular preference is given to a luminescence in the range of 400–600 nm at excitation wavelengths of from 200 to 500 nm, and with very particular preference in the range from 300 to 400 nm. It is possible as a result to read out the information by excitation with a light source having a preferred emission range of 200–500 nm, with very particular preference of 300–400 $\mu$m. Accordingly, suitable light sources are all those having an appropriate emission spectrum, with particular preference UV mercury lamps and lasers. Thus it is also possible to read different information, intended in turn for different recipients, in the different layers of the coating in the case, for example, of the multilayer coatings described below, by means of 2-photon fluorescence spectroscopy, for example.

In a further embodiment, the invention therefore provides for the use of at least one polymer composition as a data recording medium, wherein the polymer composition is applied to a support, especially to labels, adhesive tapes, films (smart labels), coated or metallic surfaces (smart coatings), after which a crosslinking pattern is introduced into the coating by position-resolved exposure to high-energy radiation, especially UV light, and, finally, said crosslinking pattern is read out.

In particular, the addition polymer is applied to the support from the melt, as a solution, or as an aqueous dispersion; in the case of the solution or aqueous dispersion, the solvent or the water is removed, the addition polymer is subsequently subjected to position-resolved exposure to high energy radiation, especially UV light, and, accordingly, information is introduced into the polymer, in a position-resolved manner, and this information is then read out.

In the context of the present invention it is also possible for regions exposed and unexposed to light to differ in their fluorescence intensity. In this case, the information is preferably read out on the basis of the local change in fluorescence intensity.

Consequently, the invention also provides for the use of at least one polymer composition as a data recording medium, wherein reading out is done by analyzing the local refractive index change or the change in the local infrared absorption spectra or Raman reflectance spectra or else the local change in fluorescence.

There are no special requirements relating to the irradiation and read devices that are to be used, except that the device for irradiation must deliver, to a sufficient extent, energy in a wavelength of the irradiated light which is attuned to the photoinitiator (for exposure and read out) or fluorescence chromophore (only for reading out the information) used in the polymer composition, i.e., which is capable of activating it. The laser used—for example—does not therefore need to be tunable. It is sufficient if it provides light of the "right" wavelength, i.e., the wavelength attuned to the photoinitiator (for exposure and read out) or fluorescence chromophore (only for reading out the information), in the required amount. Similar comments apply to the read device as well: in other words, it too must be able to evaluate the corresponding signals supplied, as a function of the photoinitiator or fluorescence chromophore and, respectively, polymer used.

In order to ensure the long term stability of the data recording medium, it is necessary to protect the layer comprising the polymer composition with radiation active compounds. In the context of the present invention, this may be done, for example, by means of an additional UV absorbing layer.

By a UV absorbing layer there is meant in the context of the present invention a layer which absorbs light with a wavelength <500 nm, in particular <450 nm, with particular preference <400 nm.

In one preferred embodiment, especially in the context of the use of fluorescence chromophores, the invention accordingly provides for the use of a polymer composition as a data recording medium, wherein the polymer composition is applied to a support, then a crosslinking pattern is introduced into the coating by position-resolved exposure to high energy radiation, especially UV light, then an additional UV absorbing layer is applied, and finally the crosslinking pattern is read out.

The UV absorbing layer particularly comprises a UV stabilizer, i.e., a substance which absorbs light of the corresponding wavelength.

Examples of suitable UV stabilizers are compounds from the following classes of substance: benzophenones, benzotriazoles and HALS compounds. Mention may be made in particular of the following: Lowilite® 20, Lowilite® 20-S, Lowilite® 22, Lowilite® 24, Lowilite® 26, Lowilite® 27, Lowilite® 55, Lowilite® 76, Lowilite® 77, Lowilite® 63, Uvasil® 299 LM, Uvasil® 299 HM, Uvasil® 2000 LM, Uvasil® 2000 HM, Chimassorb® 81, Chimassorb® 119, Chimassorb® 944, Tinuvin® 123, Tinuvin® 144, Tinuvin® 213, Tinuvin® 234, Tinuvin® 312, Tinuvin® 320, Tinuvin® 326, Tinuvin® 327, Tinuvin® 328, Tinuvin® 329, Tinuvin® 350, Tinuvin® 360, Tinuvin® 571, Tinuvin® 622, Tinuvin® 765, Tinuvin® 770, Tinuvin® 1577, Tinuvin® P, Uvitex® OB, Uvitex® FP.

In the context of the present invention, it is also possible to use mixtures of two or more UV stabilizers.

Particular preference is given to the use of acetophenone, benzophenone, derivatives of acetophenone or benzophenone, or a mixture of two or more thereof in the UV absorbing layer.

The UV absorbers used absorb light with a wavelength <500 nm, especially <450 nm, with particular preference <400 nm. This leads to effective shielding of the layer comprising the polymer composition against UV light.

In accordance with the invention, the UV absorbing layer may be applied as a film, in particular as a polymer film, or as a wet coating formulation. Particular preference is given in the context of the present invention to films, examples being polyethylene terephthalate (PET) films, polycarbonate (PC) films, and polyvinyl chloride (PVC) films.

By means of the process cited above, therefore, it is possible to effect permanent storage (similarly to a CD ROM) of digital information in conventional coating compositions, such as UV crosslinkable coating materials or adhesive films, for example. One possible application would be a smartcoating in which, for example, a label or product information can be written, invisible to the customer, as nowadays occurs with the widely known barcodes (although in this case the information is perceptible as such to the customer/user). It is possible to conceive, in particular, of automotive finishes, especially the clearcoats on the surface (topcoats), which have been provided with one or more items of information by means of the treatment outlined above. Also conceivable are applications in the context of product security (fraud protection), anticounterfeiting protection for credit cards and identity documents, and in kanban systems.

It is of course also possible to apply two or more layers of the inventively used polymer composition to a substrate which can be chosen arbitrarily. This is done, for example, by casting a first layer and then subjecting it to UV irradiation, and then applying further layers, first of all by casting, and then irradiating them accordingly. By means of such a procedure it is possible to apply very different information, including in particular information which is to be evaluable at different locations and/or by different persons, by providing the persons in question, for example, with only the instruments having the configuration required to deliver in fact the specific information accessible only to these persons. It is simple to achieve by appropriately adapting the read device in respect of the depth of penetration it is able to reach.

Furthermore, the present invention provides a composite at least comprising one support and one layer comprising at least one radiation crosslinkable polymer composition preferably comprising at least one fluorescence chromophore.

The support may be, for example, of plastic, metal, glass or ceramic. Use is made in particular of supports comprising polymer films, preferably UV transparent films, such as polyester films or polyamide films, polyethylene film, and polypropylene films, for example. Through the use of flexible supports, it is possible to use the composite in particular on curved surfaces.

In one preferred embodiment, the composite further comprises a UV absorbing layer, in which case the layer comprising at least one radiation crosslinkable polymer composition preferably comprising at least one fluorescence chromophore is positioned between the support and the UV absorbing layer.

The invention particularly provides a composite wherein the UV absorbing layer comprises acetophenone, benzophenone, a derivative of acetophenone or benzophenone, or a mixture of two or more thereof.

In the context of the present invention it is possible to use a UV transparent support, i.e., one which is transparent at a wavelength of from 200 to 400 nm, preferably from 250 to 360, with particular preference from 250 to 340, so that the layer comprising at least one radiation crosslinkable polymer composition preferably comprising at least one fluorescence chromophore may be exposed from the support side in order to apply the information, and this side is subsequently laminated by adhesive bonding, for example, with a substrate which is not UV transparent.

However, it is likewise possible in accordance with the invention for the layer comprising at least one radiation crosslinkable polymer composition preferably comprising at least one fluorescence chromophore to be applied to a support which is not UV transparent, then to be irradiated, and for the UV absorbing layer to be applied only after the information has been applied as a result of the exposure.

The invention is illustrated below with reference to examples.

EXAMPLES

Polymer Composition without a Fluorescence Chromophore

A polymer layer (50 g/m$^2$) consisting of a copolymer of 60% by weight methyl methacrylate and 40% by weight acryloyloxybenzophenone (K value 50 (1% strength solution in THF, 21° C.)) was applied from the melt at a temperature of 160° C. to a glass surface using a coating bar and, by means of two overlapping laser beams with a wavelength of 300 nm, a position-resolved crosslinking was induced and was read out by means of confocal Raman spectroscopy in the wavelength range from 1000 to 1700 cm$^{-1}$. In this case, the positional resolution possible was approximately ±2.5 micrometers, with the position-resolved carbonyl signal in the Raman spectrum of the acryloyloxybenzophenone being used as the "probe".

Furthermore, the crosslinked regions differ in refractive index as a function of the degree of crosslinking.

FIG. 1 shows the refractive index [$n_{D25}$] (plotted to the ordinate) as a function of the UV dose [mJ/cm$^2$] (plotted to the abscissa). It is evident that the sample has a different refractive index as a function of the UV dose and thus of the degree of crosslinking.

Polymer Composition with Fluorescence Chromophore

A polymer layer (approximately 50 g/m$^2$) consisting of a copolymer of 50% MMA, 40% BA, 9.5% photoinitiator and 0.5% admixed dicyanostilbene was applied to a thin glass slide and laminated with a film impermeable to UV. Using a mask and a UV source, text was then written from the slide side.

A label was obtained from which the written information could be read out on excitation with a light source, as a result of local differences in fluorescence intensity. The text was invisible under normal daylight. Only a UV light source whose emission wavelength is attuned to the absorption of the chromophore unexposed to light (approximately 400 nm) made it possible to view the text.

We claim:

1. A method of recording information, wherein the information to be recorded is introduced as crosslinking pattern into a polymer layer by position-resolved (local) irradiation of a layer of a radiation-crosslinkable polymer composition, the crosslinking pattern being thereby produced, and wherein the information contained in the crosslinking pattern can be read out as a result of a local change in infrared absorption, Raman reflectance, fluorescence, luminescence and/or in the refractive index generated in the polymer composition by the crosslinking;
   wherein the radiation crosslinkable polymer composition is on a support; and
   wherein following the exposure of the coating a UV absorbing layer is applied.

2. The method of claim 1, wherein the polymer composition comprises a radiation activatable compound (photo initiator) which causes crosslinking upon irradiation.

3. The method as claimed in claim 1, wherein the polymer composition comprises a radiation activatable compound which is selected from acetophenone, benzophenone, a derivative of acetophenone or of benzophenone, which can also be copolymer-attached.

4. The method as claimed in claim 1, wherein the polymer composition comprises a fluorescence chromophore, which can also be incorporated by copolymerization.

5. The method as claimed in claim 1, wherein the polymer composition comprises a fluorescence chromophore which is selected from the group consisting of coumarin, (bis)stilbene, perylene, phenanthridine, fluorene, a derivative of coumarin, (bis)stilbene, perylene, phenanthridine, fluorene, and combinations thereof.

6. The method as claimed in claim 1, wherein the support is selected from the group consisting of labels, adhesive tapes, films (smart labels), coated, and metallic surfaces (smart coatings).

7. A method of recording and retrieving information, wherein the information is recorded by the method as claimed in claim 1, and wherein the information is retrieved by reading out the information contained in the crosslinking pattern through the analysis of the local changes of the refractive index, the infrared absorption spectrum, the Raman reflectance spectrum, the fluorescence or the luminescence in the polymer layer.

8. A method of recording and retrieving information, wherein the information is recorded by the method as claimed in claim 1, and wherein the information is retrieved by reading out the information contained in the crosslinking pattern through the analysis of the local changes of the refractive index, the infrared absorption spectrum, the Raman reflectance spectrum, the fluorescence or the luminescence in the polymer layer.

9. A method of recording information, wherein the information to be recorded is introduced as crosslinking pattern into a polymer layer by position-resolved (local) irradiation of a layer of a radiation-crosslinkable polymer composition, the crosslinking pattern being thereby produced, and wherein the information contained in the crosslinking pattern can be read out as a result of a local change in infrared absorption, Raman reflectance, fluorescence, luminescence and/or in the refractive index generated in the polymer composition by the crosslinking;
   wherein the information is a digitalized information.

10. The method of claim 9, wherein the polymer composition comprises a radiation activatable compound (photo initiator) which causes crosslinking upon irradiation.

11. The method as claimed in claim 10, wherein the polymer composition comprises a radiation activatable compound which is selected from acetophenone, benzophenone, a derivative of acetophenone or of benzophenone, which can also be copolymer-attached.

12. The method as claimed in claim 9, wherein the polymer composition comprises a radiation activatable compound which is selected from acetophenone, benzophenone, a derivative of acetophenone or of benzophenone, which can also be copolymer-attached.

13. The method as claimed in claim 9, wherein the polymer composition comprises a fluorescence chromophore, which can also be incorporated by copolymerization.

14. The method as claimed in claim 9, wherein the polymer composition comprises a fluorescence chromophore which is selected from the group consisting of coumarin, (bis)stilbene, perylene, phenanthridine, fluorene, a derivative of coumarin, (bis)stilbene, perylene, phenanthridine, fluorene, and combinations thereof.

15. The method as claimed in claim 9, wherein the radiation crosslinkable polymer composition is on a support.

16. The method as claimed in claim 9, wherein the radiation crosslinkable polymer composition is on a support; wherein the support is selected from the group consisting of labels, adhesive tapes, films (smart labels), coated, and metallic surfaces (smart coatings).

17. A method of recording and retrieving information, wherein the information is recorded by the method as claimed in claim 9, and wherein the information is retrieved by reading out the information contained in the crosslinking pattern through the analysis of the local changes of the refractive index, the infrared absorption spectrum, the Raman reflectance spectrum, the fluorescence or the luminescence in the polymer layer.

18. A method of recording information, wherein the information to be recorded is introduced as crosslinking pattern into a polymer layer by position-resolved (local) irradiation of a layer of a radiation-crosslinkable polymer composition, the crosslinking pattern being thereby produced, and wherein the information contained in the crosslinking pattern can be read out as a result of a local change in infrared absorption, Raman reflectance, fluorescence, luminescence and/or in the refractive index generated in the polymer composition by the crosslinking;

wherein the information to be recorded is introduced as a crosslinking pattern in the form of dot codes or bar codes into the polymer layer.

19. The method of claim 18, wherein the polymer composition comprises a radiation activatable compound (photo initiator) which causes crosslinking upon irradiation.

20. The method as claimed in claim 18, wherein the polymer composition comprises a fluorescence chromophore, which can also be incorporated by copolymerization.

21. The method as claimed in claim 18, wherein the polymer composition comprises a fluorescence chromophore which is selected from the group consisting of coumarin, (bis)stilbene, perylene, phenanthridine, fluorene, a derivative of coumarin, (bis)stilbene, perylene, phenanthridine, fluorene, and combinations thereof.

22. The method as claimed in claim 18, wherein the radiation crosslinkable polymer composition is on a support.

23. The method as claimed in claim 18, wherein the radiation crosslinkable polymer composition is on a support; wherein the support is selected from the group consisting of labels, adhesive tapes, films (smart labels), coated, and metallic surfaces (smart coatings).

* * * * *